(12) United States Patent
Okumura et al.

(10) Patent No.: US 11,043,517 B2
(45) Date of Patent: Jun. 22, 2021

(54) SEMICONDUCTOR CRYSTAL SUBSTRATE, INFRARED DETECTOR, METHOD FOR PRODUCING SEMICONDUCTOR CRYSTAL SUBSTRATE, AND METHOD FOR PRODUCING INFRARED DETECTOR

(71) Applicant: FUJITSU LIMITED, Kawasaki (JP)

(72) Inventors: Shigekazu Okumura, Setagaya (JP); Shuichi Tomabechi, Atsugi (JP); Ryo Suzuki, Fujisawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/892,615

(22) Filed: Jun. 4, 2020

(65) Prior Publication Data
US 2020/0295059 A1   Sep. 17, 2020

Related U.S. Application Data

(62) Division of application No. 15/486,671, filed on Apr. 13, 2017, now Pat. No. 10,720,455.

(30) Foreign Application Priority Data

Jun. 10, 2016   (JP) .............................. JP2016-116470

(51) Int. Cl.
*H01L 31/0304*   (2006.01)
*H01L 27/144*   (2006.01)
(Continued)

(52) U.S. Cl.
CPC .... *H01L 27/1443* (2013.01); *H01L 21/02395* (2013.01); *H01L 21/02398* (2013.01);
(Continued)

(58) Field of Classification Search
CPC .......... H01L 31/035236; H01L 31/105; H01L 31/03046; H01L 21/02549; H01L 31/0304;
(Continued)

(56) References Cited

U.S. PATENT DOCUMENTS

2005/0067614 A1 * 3/2005 Edamura ................ B82Y 10/00
257/14
2008/0067547 A1   3/2008 Bergman et al.
(Continued)

FOREIGN PATENT DOCUMENTS

EP      2648234 A1   10/2013
EP      2894680 A1    7/2015
(Continued)

OTHER PUBLICATIONS

Lazzari et al., 2007, AIP Conference Proceedings 890, 115 (Year: 2007).*

(Continued)

*Primary Examiner* — Steven H Loke
*Assistant Examiner* — Samuel Park
(74) *Attorney, Agent, or Firm* — Fujitsu Patent Center

(57) ABSTRACT

A semiconductor crystal substrate includes a crystal substrate that is formed of a material including one of GaSb and InAs, a first buffer layer that is formed on the crystal substrate and formed of a material including GaSb, and a second buffer layer that is formed on the first buffer layer and formed of a material including GaSb. The first buffer layer has a p-type conductivity, and the second buffer layer has an n-type conductivity.

6 Claims, 16 Drawing Sheets

(51) Int. Cl.
  *H01L 21/02* (2006.01)
  *H01L 31/0352* (2006.01)
  *H01L 31/18* (2006.01)

(52) U.S. Cl.
  CPC .. *H01L 21/02466* (2013.01); *H01L 21/02507* (2013.01); *H01L 21/02549* (2013.01); *H01L 21/02576* (2013.01); *H01L 21/02579* (2013.01); *H01L 21/02631* (2013.01); *H01L 27/1446* (2013.01); *H01L 31/03046* (2013.01); *H01L 31/035236* (2013.01); *H01L 31/1844* (2013.01)

(58) Field of Classification Search
  CPC ......... H01L 21/02463; H01L 21/02466; H01L 21/02507; H01L 21/02546; H01L 31/03042; H01L 31/101; H01L 27/14694; H01L 31/0693; H01L 31/0735; H01L 31/184; H01L 2924/10329; H01L 21/02; H01L 29/66975; H01L 29/785; H01L 31/109; H01L 29/205; H01L 27/1443; H01L 31/1844; H01L 27/1446; H01L 21/02576; H01L 21/02395; H01L 21/02631; H01L 21/02398; H01L 21/02579

See application file for complete search history.

(56) References Cited

U.S. PATENT DOCUMENTS

| | | | | |
|---|---|---|---|---|
| 2008/0203425 | A1* | 8/2008 | Sulima | H01L 31/03046 257/185 |
| 2009/0224228 | A1 | 9/2009 | Razeghi | |
| 2009/0256231 | A1 | 10/2009 | Klipstein | |
| 2011/0260278 | A1 | 10/2011 | Prineas et al. | |
| 2012/0223362 | A1 | 9/2012 | Belenky et al. | |
| 2014/0264270 | A1* | 9/2014 | Dutta | H01L 27/1464 257/14 |
| 2015/0097157 | A1 | 4/2015 | Onakado | |
| 2015/0179844 | A1 | 6/2015 | Ergun et al. | |

FOREIGN PATENT DOCUMENTS

| | | |
|---|---|---|
| JP | H03-129721 A | 6/1991 |
| JP | 2015-109388 A | 6/2015 |

OTHER PUBLICATIONS

Bleuel et al., Jun. 2001, IEEE Photonics Technology Letters, vol. 13, Issue 7 (Year: 2012).*

M. Lee et al., "A photoluminescence and Halleffect study of GaSb grown by molecularbeam epitaxy", AIP Journal of Applied Physics 59, 2895 (1986) (7 pages).

EESR—Extended European Search Report dated Oct. 18, 2017 issued with respect to the corresponding European Patent Apptication No. 17165717.4 (Office Action).

USPTO, (Park) Notice of Allowance and Notice of Allowability, dated Mar. 13, 2020, in parent U.S. Appl. No. 15/486,671 [pending].

USPTO, (Park) Non-Final Rejection, dated Aug. 8. 2019, in parent U.S. Appl. No. 15/486,671 [pending].

USPTO, (Park) Final Rejection, dated Dec. 11, 2018, in parent U.S. Appl. No. 15/486,671 [pending].

USPTO, (Park) Non-Final Rejection, dated May 18, 2018, in parent U.S. Appl. No. 15/486,671 [pending].

USPTO, (Park) Requirement for Restriction/Election, dated Jan. 22, 2018, in parent U.S. Appl. No. 15/486,671 [pending].

EPOA—Office Action dated Feb. 4, 2021 issued with respect to the corresponding European Patent Application No. 17165717.4.

* cited by examiner

SEMICONDUCTOR CRYSTAL SUBSTRATE, INFRARED DETECTOR, METHOD FOR PRODUCING SEMICONDUCTOR CRYSTAL SUBSTRATE, AND METHOD FOR PRODUCING INFRARED DETECTOR

CROSS-REFERENCE TO RELATED APPLICATION

This application is a divisional of application Ser. No. 15/486,671, filed Apr. 13, 2017, which is based upon and claims the benefit of priority of the prior Japanese Patent Application No. 2016-116470 filed on Jun. 10, 2016, the entire contents of which are incorporated herein by reference.

FIELD

An aspect of this disclosure relates to a semiconductor crystal substrate, an infrared detector, a method for producing the semiconductor crystal substrate, and a method for producing the infrared detector.

BACKGROUND

There exist infrared detectors comprised of semiconductor materials. An example of such an infrared detector has a configuration where an infrared absorption layer with an InAs/GaSb superlattice structure is formed on a GaSb substrate. The InAs/GaSb superlattice structure forming the infrared absorption layer is a type-II superlattice (T2SL) structure and has a type-II band lineup. Accordingly, by adjusting the film thickness and the period of the superlattice of the InAs/GaSb superlattice structure, it is possible to obtain an infrared detector that is sensitive in a wavelength range from a middle wave (MW) infrared wavelength of 3-5 μm to a long wave (LW) infrared wavelength of 8-10 μm.

A PIN-type infrared detector with a T2SL structure uses interband optical absorption. For this reason, it is expected that a PIN-type infrared detector with a T2SL structure will have improved temperature characteristics compared with a quantum dot infrared photodetector (QDIP) and a quantum well infrared photodetector (QWIP) that use intersubband optical absorption. Such a PIN-type infrared detector with a T2SL structure is desired to have high light sensitivity and a low dark current in addition to improved temperature characteristics.

To obtain a PIN-type infrared detector using a T2SL structure and having high light sensitivity and a low dark current, it is necessary to form a high-quality T2SL crystal in the infrared absorption layer. Also, to form a high-quality T2SL crystal, it is necessary to form a GaSb buffer layer with high flatness below the infrared absorption layer (see, for example, Japanese Laid-Open Patent Publication No. 2015-109388 and Japanese Laid-Open Patent Publication No. 03-129721). For example, "M. Lee et al., Journal of Applied Physics 59, 2895 (1986)" proposes improving the quality of a GaSb buffer layer by changing the growth temperature and the V/III ratio in molecular beam epitaxy (MBE). Specifically, "M. Lee et al., Journal of Applied Physics 59, 2895 (1986)" discloses that an excellent GaSb layer can be formed by performing epitaxial growth at a growth temperature between 500° C. and 550° C. and with a V/III ratio between 5 and 10.

SUMMARY

According to an aspect of this disclosure, there is provided a semiconductor crystal substrate. The semiconductor crystal substrate includes a crystal substrate that is formed of a material including one of GaSb and InAs, a first buffer layer that is formed on the crystal substrate and formed of a material including GaSb, and a second buffer layer that is formed on the first buffer layer and formed of a material including GaSb. The first buffer layer has a p-type conductivity, and the second buffer layer has an n-type conductivity.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Although "M. Lee et al., Journal of Applied Physics 59, 2895 (1986)" proposes improving the quality of a GaSb buffer layer as described above, it is not possible to form a high-quality T2SL crystal that fully satisfies the desired characteristics of an infrared absorption layer by just forming a GaSb buffer layer under various conditions. Accordingly, there is a demand for a semiconductor crystal substrate including a GaSb buffer layer with a highly-flat surface.

Embodiments of the present invention are described below with reference to the accompanying drawings. The same reference numbers are assigned to the same components throughout the drawings, and repeated descriptions of those components are omitted.

First Embodiment

Figure 1:
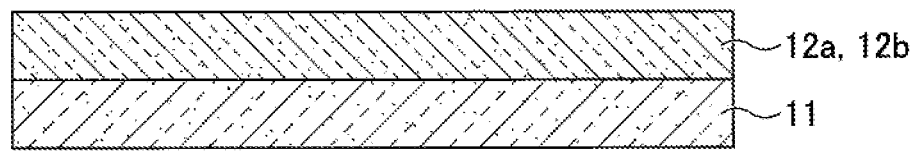
FIG. 1 is a drawing illustrating an exemplary structure of a semiconductor crystal substrate where a GaSb layer is formed on a GaSb substrate.

The inventors studied the relationship between film-forming conditions and flatness of a GaSb film. Specifically, as illustrated by FIG. 1, semiconductor crystal substrates were prepared by forming a GaSb layer 12a and a GaSb layer 12b under different film-forming conditions on a GaSb substrate 11, and the flatness of surfaces of the GaSb layer 12a and the GaSb layer 12b was measured. The flatness of the surfaces of the GaSb layer 12a and the GaSb layer 12b was measured using an atomic force microscope (AFM). Each of the GaSb layer 12a and the GaSb layer 12b was formed by solid source molecular beam epitaxy (SSMBE) at a V/III ratio of about 10.

Figure 2:
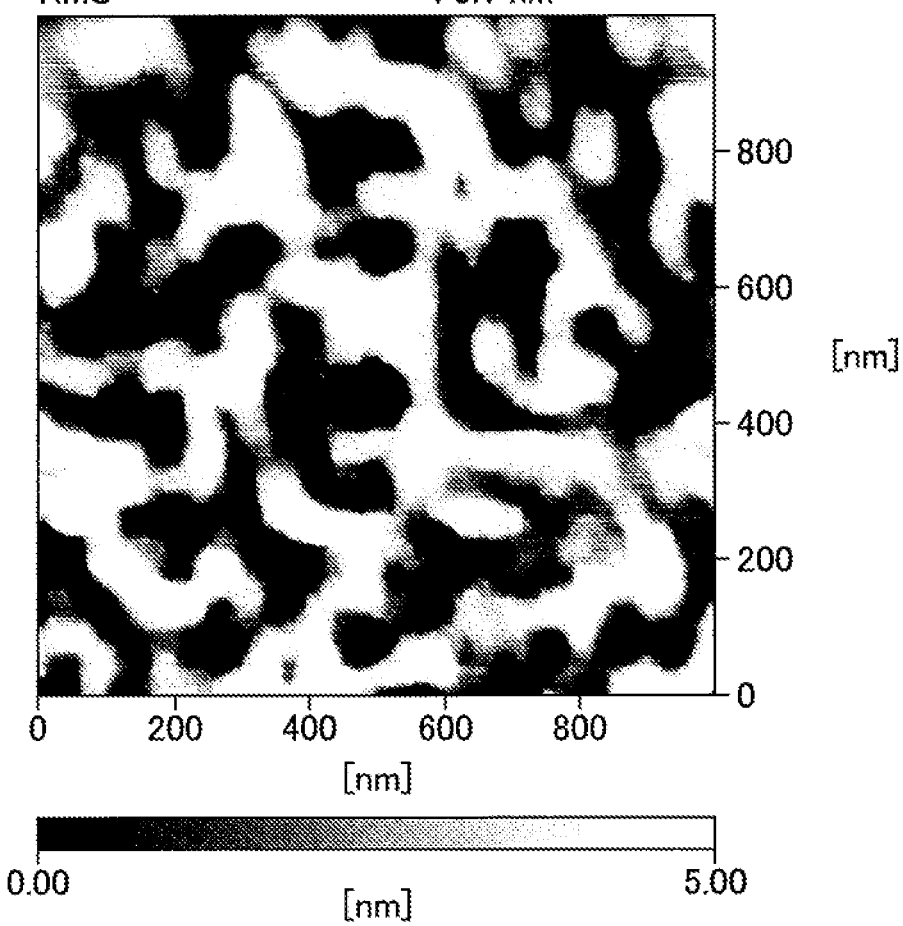
FIG. 2 is a drawing illustrating an AFM image of a surface of a GaSb substrate.

An oxide film formed on a surface of the GaSb substrate 11 was removed by heating the GaSb substrate 11 at a temperature of about 500° C. in vacuum. FIG. 2 is an AFM image of the surface of the GaSb substrate 11 after the oxide film is removed. As indicated by FIG. 2, when the oxide film is removed from the surface of the GaSb substrate 11 made of a semiconductor crystal, the surface of the GaSb substrate 11 becomes uneven. Measured surface roughness (RMS) of the surface of the GaSb substrate 11, from which the oxide film was removed, was 3.1 nm. The measurement range of surface roughness (RMS) was 1 μm×1 μm (which also applies to the measurement of surface roughness of GaSb layers described later).

Figure 3:
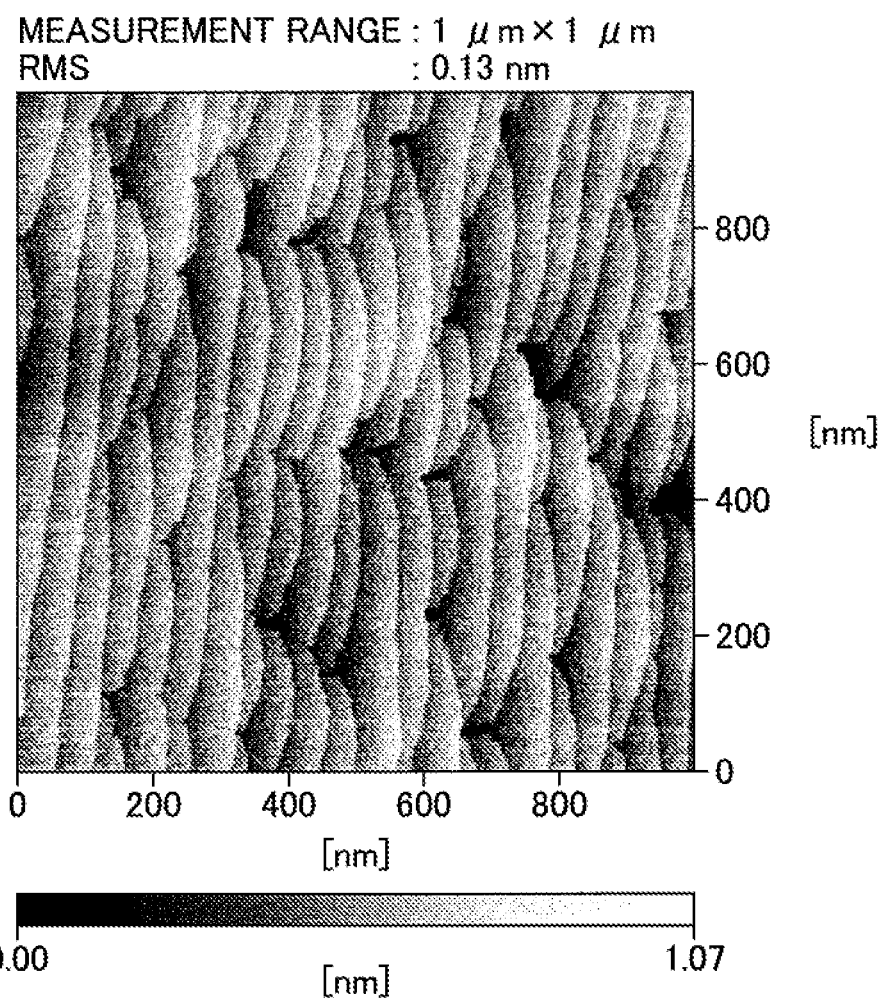
FIG. 3 is a drawing illustrating an AFM image of a surface of a GaSb layer formed on a GaSb substrate at a substrate temperature of 520° C.

Next, the GaSb layer 12a with a thickness of 500 nm was formed by MBE at a substrate temperature of 520° on the GaSb substrate 11 from which the oxide film was removed. FIG. 3 is an AFM image of a surface of the GaSb layer 12a formed under this condition. The surface roughness (RMS) of the GaSb layer 12a was 0.13 nm. Thus, the surface of the GaSb substrate 11 or the semiconductor crystal substrate can be planarized by forming the GaSb layer 12a.

Figure 4:
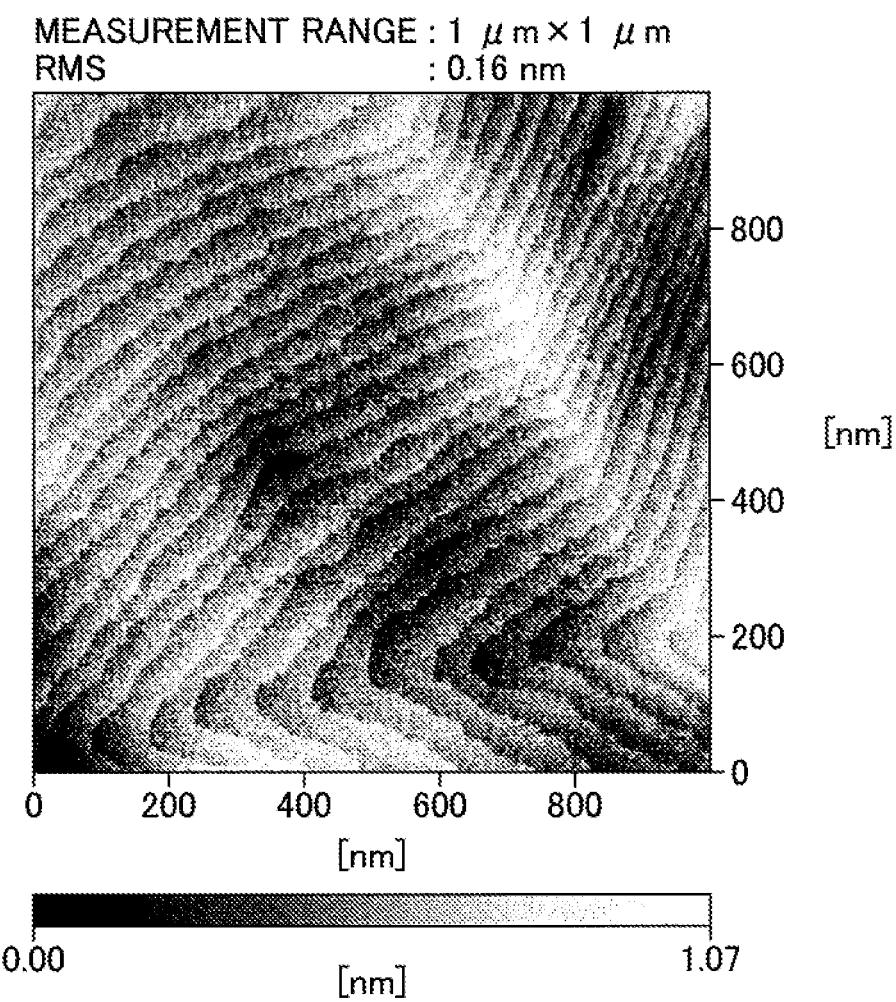
FIG. 4 is a drawing illustrating an AFM image of a surface of a GaSb layer formed on a GaSb substrate at a substrate temperature of 440° C.

Also, the GaSb layer 12b with a thickness of 500 nm was formed by MBE at a substrate temperature of 440° C. on the GaSb substrate 11 from which the oxide film was removed. FIG. 4 is an AFM image of a surface of the GaSb layer 12b formed under this condition. The surface roughness (RMS) of the GaSb layer 12b was 0.16 rm. Thus, although the GaSb layer 12b is not as flat as the GaSb layer 12a formed at the substrate temperature of 520° C., the surface of the GaSb substrate 11 or the semiconductor crystal substrate can also be planarized by forming the GaSb layer 12b.

Here, as can be seen in FIG. 3, pits or dents are formed in the surface of the GaSb layer 12a formed at the substrate temperature of 520° C. The pits are relatively deep, have a depth of several nm, and exist at a density of about $10^9$ cm$^{-2}$. When an infrared absorption layer with a T2SL structure is formed on the GaSb layer 12a having pits in its surface, dislocations and defects tend to be formed in the infrared absorption layer due to the pits. This in turn may reduce the light sensitivity and increase the dark current of an infrared detector.

On the other hand, as can be seen in FIG. 4, no pit is formed in the surface of the GaSb layer 12b formed at the substrate temperature of 440° C. However, the surface roughness of the GaSb layer 12b is greater than the surface roughness of the GaSb layer 12a formed at the substrate temperature of 520° C.

Next, the conductivity of the GaSb layer 12a and the GaSb layer 12b formed at different substrate temperatures was examined. As a result of the examination, it was found out that the GaSb layer 12a formed by MBE at the substrate temperature of 520° C. had p-type conductivity, and the GaSb layer 12b formed by MBE at the substrate temperature of 440° C. had n-type conductivity. Also, the carrier concentrations in the GaSb layer 12a formed at the substrate temperature of 520° C. and the GaSb layer 12b formed at the substrate temperature of 440° C. were measured by using a capacitance-voltage (CV) technique. The carrier concentration in the GaSb layer 12a was about $1 \times 10^{18}$ cm$^{-3}$, and the carrier concentration in the GaSb layer 12b was about $4 \times 10^{18}$ cm$^{-3}$. Further, the GaSb layer 12a and the GaSb layer 12b were analyzed by secondary ion mass spectrometry (SIMS), and it was found out that the concentration of an impurity element (dopant) in each of the GaSb layer 12a and the GaSb layer 12b was less than or equal to $1 \times 10^{17}$ cm$^{-3}$.

The above results indicate that Sb is easily removed from a formed GaSb layer when the substrate temperature is high, and the amount of Ga is slightly greater than the amount of Sb in the GaSb layer 12a formed by MBE at the substrate temperature of 520° C. Accordingly, it is assumed that a part of Ga enters the site of Sb in the GaSb crystal and as a result, the GaSb layer 12a exhibits p-type conductivity. The above results also indicate that the removal of Sb from a formed GaSb layer is suppressed when the substrate temperature is low, and the amount of Sb is slightly greater than the amount of Ga in the GaSb layer 12b formed by MBE at the substrate temperature of 440° C. Accordingly, it is assumed that a part of Sb enters the site of Ga in the GaSb crystal and as a result, the GaSb layer 12b exhibits n-type conductivity.

Here, when the substrate temperature during the formation of a GaSb layer is high, the movement of Ga atoms due to surface migration becomes active. On the other hand, when the substrate temperature is low, the movement of Ga atoms due to surface migration becomes less active. Accordingly, it is assumed that the distance of movement of Ga atoms due to surface migration becomes long in the GaSb layer 12a formed at the substrate temperature of 520° C. and as a result, the surface of the GaSb layer 12a becomes flatter than the surface of the GaSb layer 12b formed at the substrate temperature of 440° C. Also, it is known that when the composition ratio of Ga is high, Ga tends to form clusters. Accordingly, it can be considered that the pits in the surface of the GaSb layer 12a formed at the substrate temperature of 520° C. are formed at the boundaries between the clusters.

Thus, the GaSb layer 12a formed at the substrate temperature of 520° C. becomes rich in Ga, this Ga enters the site of Sb and functions as an acceptor, and as a result, the GaSb layer 12a exhibits p-type conductivity. The GaSb layer 12a formed at a high substrate temperature has low surface roughness (RMS) and high flatness. However, pits tend to be formed in the GaSb layer 12a due to a high composition ratio of Ga.

On the other hand, the GaSb layer 12b formed at the substrate temperature of 440° C. becomes rich in Sb, this Sb enters the site of Ga and functions as a donor, and as a result, the GaSb layer 12b exhibits n-type conductivity. Compared with the GaSb layer 12a formed at the substrate temperature of 520° C., the GaSb layer 12b formed at a lower substrate temperature has slightly higher surface roughness (RMS). However, no pit is formed in the GaSb layer 12b because the composition ratio of Ga is low.

<Semiconductor Crystal Substrate>

Figure 5:
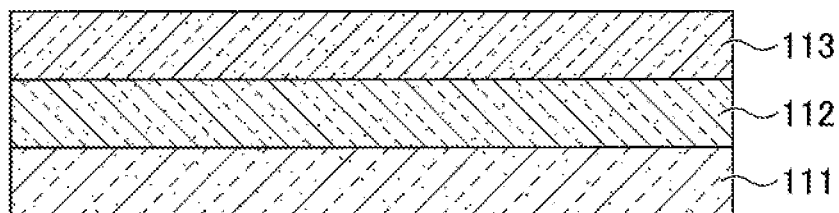
FIG. 5 is a drawing illustrating an exemplary structure of a semiconductor crystal substrate according to a first embodiment.

A semiconductor crystal substrate according to a first embodiment is obtained based on the above findings. As illustrated by FIG. 5, the semiconductor crystal substrate of the first embodiment includes a GaSb substrate 111 that is a crystal substrate, a p-type first GaSb layer 112 formed on the GaSb substrate 111, and an n-type second GaSb layer 113 formed on the first GaSb layer 112. More specifically, the first GaSb layer 112 is formed under the same condition as the GaSb layer 12a, i.e., formed by MBE at a substrate temperature of 520° C. after an oxide film is removed from the surface of the GaSb substrate 111. Also, the second GaSb layer 113 is formed under the same condition as the GaSb layer 12b, i.e., formed by MBE at a substrate temperature of 440° C. Here, the GaSb substrate 111 is substantially the same as the GaSb substrate 11.

Figure 6:
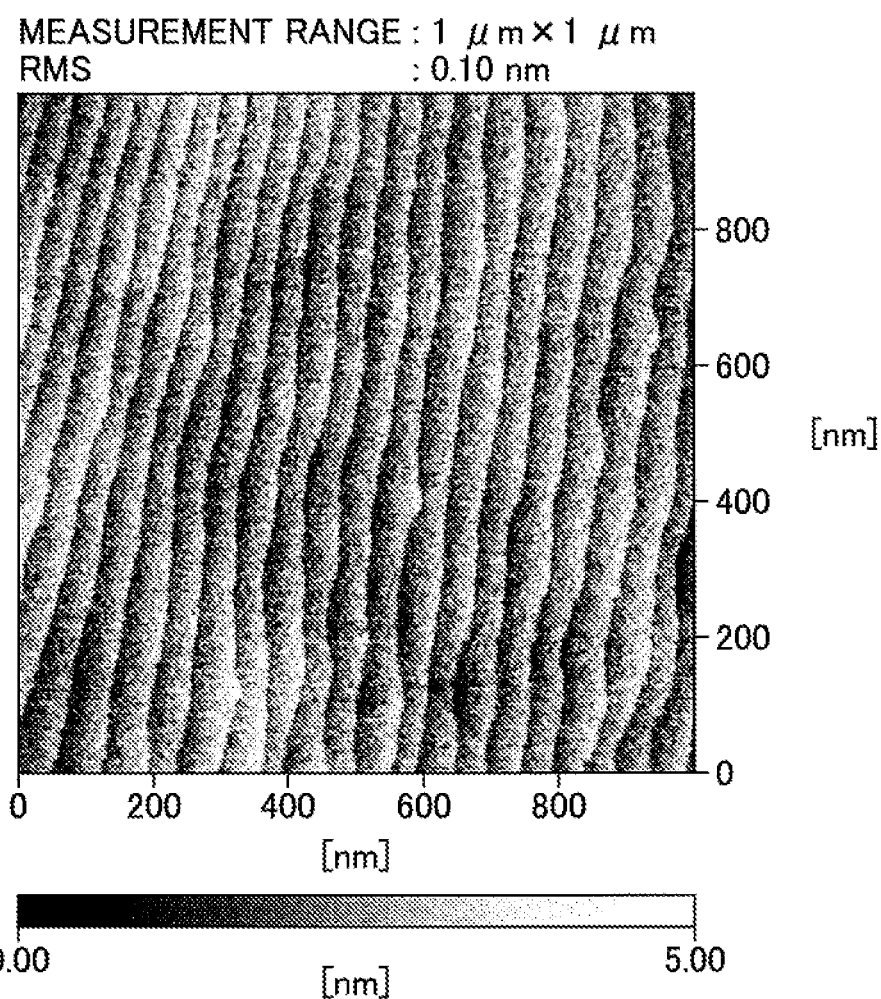
FIG. 6 is a drawing illustrating an AFM image of a surface of a GaSb layer of a semiconductor crystal substrate according to the first embodiment.

FIG. 6 is an AFM image of a surface of the second GaSb layer 113 formed on the first GaSb layer 112 as described above. The first GaSb layer 112 is formed as a substrate temperature of 520° C. and has a thickness of 100 nm. The second GaSb layer 113 is formed a; a substrate temperature of 440° C. and has a thickness of 400 nm. As illustrated in FIG. 6, the surface of the second GaSb layer 113 is flat with a surface roughness (RMS) of 0.10 nm, and no pit as in FIG. 3 is formed in the surface of the second GaSb layer 113.

Figure 7:
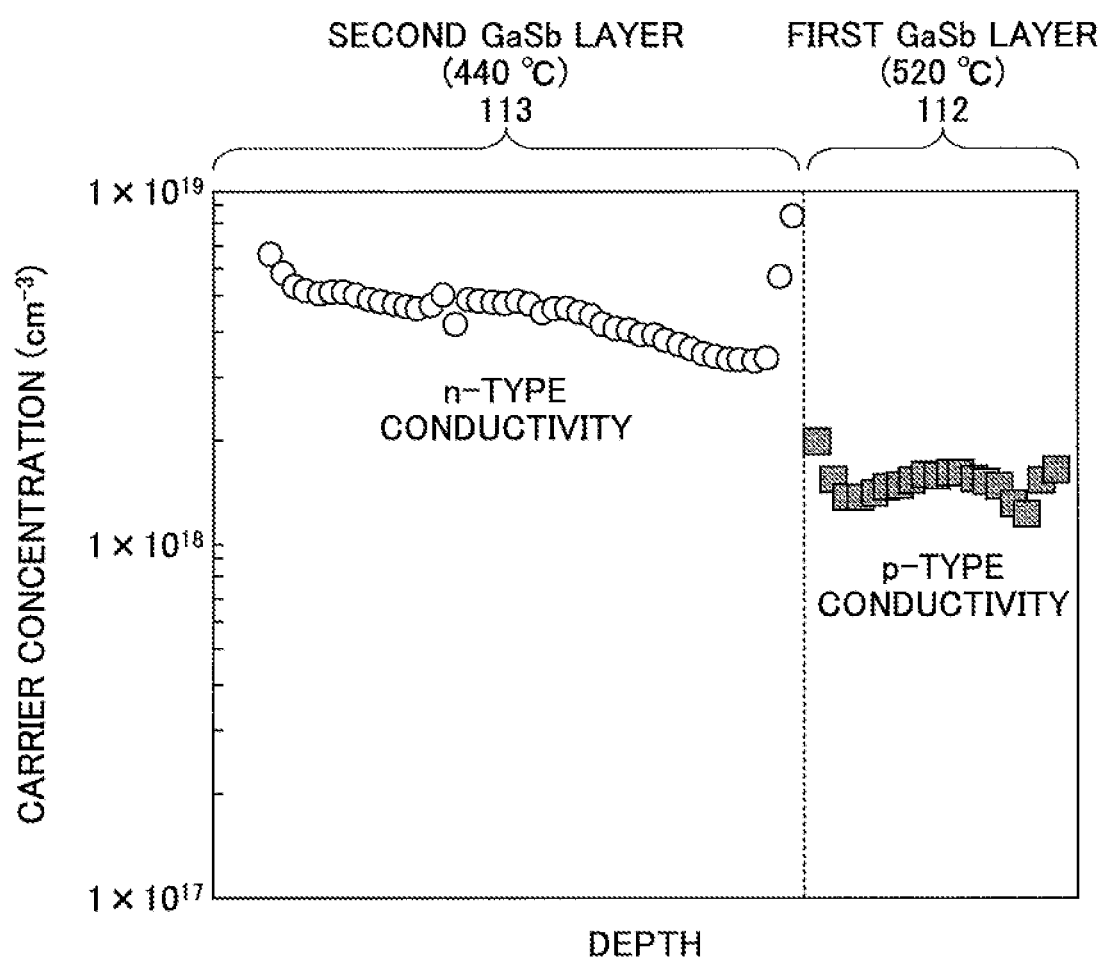
FIG. 7 is a drawing illustrating carrier concentrations in GaSb layers of a semiconductor crystal substrate according to the first embodiment.

Possible reasons why a film having a flat surface with not pit can be formed are explained below. First, because the first GaSb layer 112 is formed at a high substrate temperature of 520° C., the first GaSb layer 112 becomes rich in Ga and although pits are formed, the first GaSb layer 112 becomes mostly flat. Second, because the second GaSb layer 113 is formed on the first GaSb layer 112 at a low substrate temperature of 440° C., the second GaSb layer 113 becomes rich in Sb and no pit is formed in the surface of the second GaSb layer 113. Also, it is assumed that atoms moved due to surface migration fill the pits. These are assumed to be the reasons why the surface roughness (RMS) of the second GaSb layer 113 becomes 0.10 nm that is less than the surface roughness (RMS) 0.13 nm of the GaSb layer 12a formed at the surface temperature of 520° C. and the surface roughness (RMS) 0.16 nm of the GaSb layer 12b formed at the surface temperature of 440 T. The concentration of an impurity element (dopant) in each of the first GaSb layer 112 and the GaSb layer 113 is less than or equal to $1 \times 10^{17}$ cm$^{-3}$ and is substantially the same as that in the GaSb layer 12a and the GaSb layer 12b. FIG. 7 is a drawing illustrating carrier concentrations in the GaSb layer 112 and the GaSb layer 113 of the semiconductor crystal substrate of the present embodiment. The carrier concentrations were measured by a CV technique while etching the semiconductor crystal substrate in the depth direction. As illustrated in FIG. 7, the first GaSb layer 112 has p-type conductivity and has a carrier concentration of about $1 \times 10^{18}$ cm$^{-3}$, and the second GaSb layer 113 has n-type conductivity and has a carrier concentration of about $4 \times 10^{18}$ cm$^{-3}$.

Figure 8:
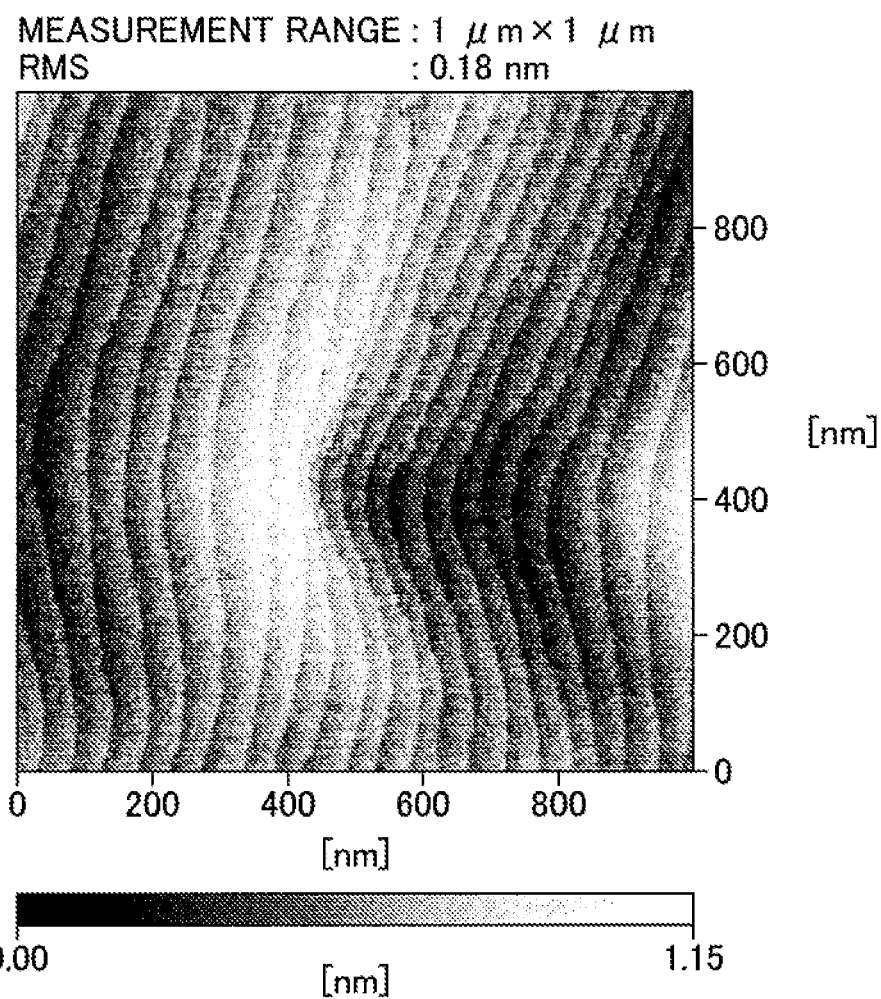
FIG. 8 is a drawing illustrating an AFM image of a surface of a second GaSb layer formed at a temperature of 470° C.

FIG. 8 is an AFM image of a surface of a test sample including the GaSb substrate 111, a first GaSb film formed on the GaSb substrate 111 by MBE at a substrate temperature of 520 t after removing an oxide film from the surface of the GaSb substrate 111, and a second GaSb film formed on the first GaSb film by MBE at a substrate temperature of 470° C. The surface roughness (RMS) of the second GaSb film of the test sample is 0.18 nm, carriers of the second GaSb film have p-type conductivity, and the carrier concentration of the second GaSb film is about $5 \times 10^{18}$ cm$^{-3}$. Thus, the surface roughness (RMS) of this test sample is not low enough.

Figure 9:
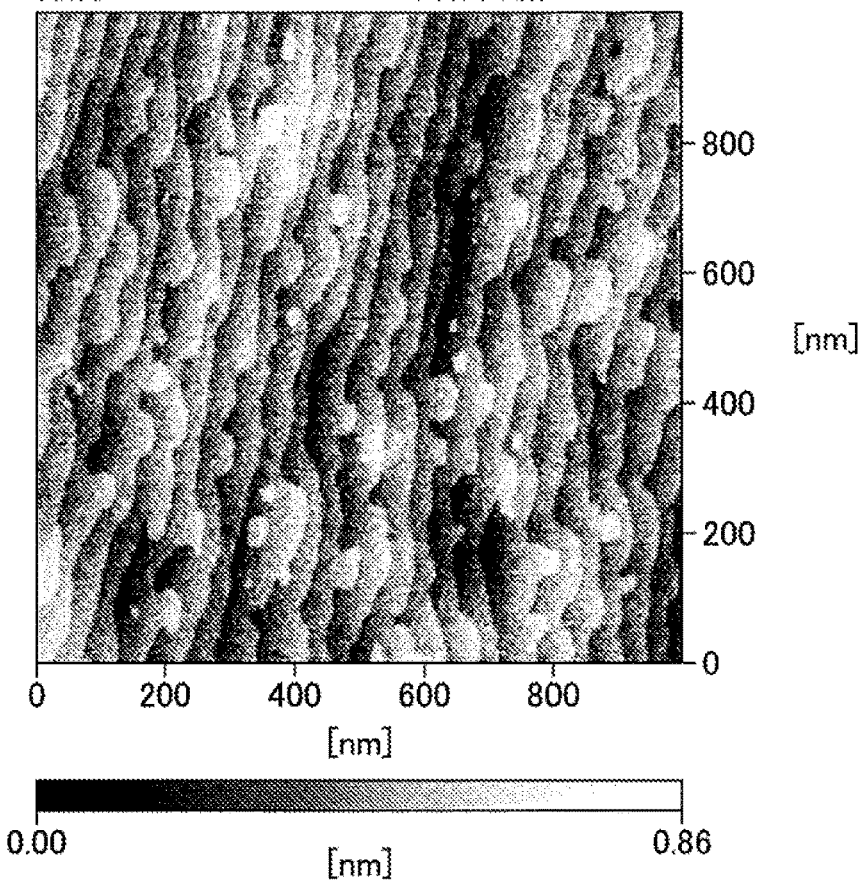
FIG. 9 is a drawing illustrating an AFM image of a surface of a second GaSb layer formed at a temperature of 410° C.

FIG. 9 is an AFM image of a surface of a test sample including the GaSb substrate 111, a first GaSb film formed on the GaSb substrate 111 by MBB at a substrate temperature of 520° C. after removing an oxide film from the surface of the GaSb substrate 111, and a second GaSb film formed on the first GaSb film by MBE at a substrate temperature of 410° C. The surface roughness (RMS) of the second GaSb film of the test sample is 0.13 nm, carriers of the second GaSb film have n-type conductivity, and the carrier concentration of the second GaSb film is about $4 \times 10^{18}$ cm$^{-3}$. Thus, the surface roughness (RMS) of this test sample is also not low enough.

In the present embodiment, the carrier concentration in each of the first GaSb layer 112 having p-type conductivity and the second GaSb layer 113 having n-type conductivity is preferably greater than or equal to $1 \times 10^{18}$ cm$^{-3}$ and less than or equal to $1 \times 10^{20}$ cm$^{-3}$. The first GaSb layer 112 with such a carrier concentration can be formed by solid source molecular beam epitaxy (SSMBE) at a substrate temperature greater than or equal to 500° C. and less than or equal to 550° C. Also, the second GaSb layer 113 with such a carrier concentration can be formed by solid source molecular beam epitaxy (SSMBE) at a substrate temperature greater than or equal to 420° C. and less than or equal to 460° C.

As described above, the semiconductor crystal substrate of the present embodiment includes the GaSb substrate 111 that is a crystal substrate, the first GaSb layer 112 formed on the GaSb substrate 111, and the second GaSb layer 113 formed on the first GaSb layer 112. The first GaSb layer 112 is rich in Ga and has p-type conductivity, and the second GaSb layer 113 is rich in Sb and has n-type conductivity. In the present application, the first GaSb layer 112 may be referred to as a first buffer layer, and the second GaSb layer 113 may be referred to as a second buffer layer.

Also in the present embodiment, each of the first buffer layer and the second buffer layer may be formed of $Ga_{1-x}In_xAs_{1-y}Sb_y$ ($0 \leq x \leq 0.1$, $0 \leq y < 1$). More specifically, each of the first buffer layer and the second buffer layer may be formed of GaInSb, GaAsSb, or GaInAsSb that is a material including In and/or As in addition to GaSb.

<Method for Producing Semiconductor Crystal Substrate>

Figure 10A:
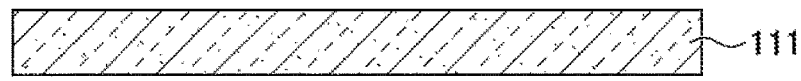
FIGS. 10A through 10C are drawings illustrating a method for producing a semiconductor crystal substrate according to the first embodiment.

Next, an exemplary method for producing a semiconductor crystal substrate according to the present embodiment is described with reference to FIGS. 10A through 10C. First, as illustrated by FIG. 10A, an n-type GaSb (001) substrate used as the GaSb substrate 111 is placed in a vacuum chamber of a solid source molecular beam epitaxy (SSMBE) apparatus. Next, the GaSb substrate 111 is heated by a heater. When the substrate temperature of the GaSb substrate 111 reaches 400° C., a surface of the GaSb substrate 111 is irradiated with an Sb beam. The beam flux of Sb is, for example, $5.0 \times 10^{-7}$ Torr. When the GaSb substrate 111 is heated further, an oxide film of GaSb formed on the surface of the GaSb substrate 111 is removed at a substrate temperature of around 500 T. Then, in a state where the Sb beam is being emitted, the GaSb substrate 111 is heated up to a substrate temperature of 530° C. and is kept in this state for 20 minutes to completely remove the oxide film of GaSb formed on the surface of the GaSb substrate 111.

Figure 10B:
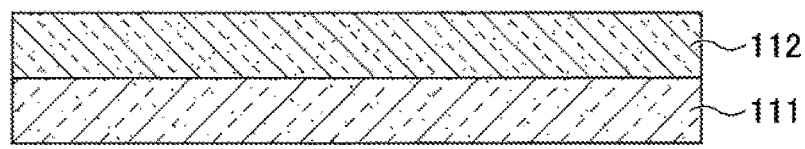

Next, as illustrated by FIG. 10B, the first GaSb layer 112 used as a first buffer layer is formed on the GaSb substrate 111. Specifically, in a state where the GaSb substrate 111 is at the substrate temperature of 520° C. and the Sb beam is being emitted, a Ga beam is also emitted to form the first GaSb layer 112. In this step, the beam flux of Ga is, for example, $5.0 \times 10^{-8}$ Torr, and the V/III ratio is 10. Under these conditions, the growth rate of the first GaSb layer 112 is 0.30 µm/h. Film forming is performed for about 20 minutes until the thickness of the first GaSb layer 112 reaches 100 nm, and then the Ga beam is stopped. The first GaSb layer 112 formed at a substrate temperature of 520° C. as described above has p-type conductivity.

Figure 10C:
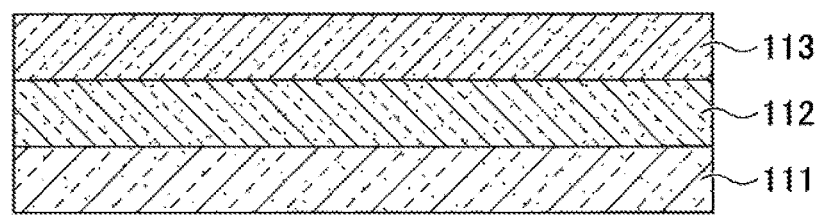

Next, as illustrated by FIG. 10C, the second GaSb layer 113 used as a second buffer layer is formed on the first GaSb layer 112 used as the first buffer layer. Specifically, in a state where the Sb beam is being emitted, the substrate temperature is dropped to 440° C. and the Ga beam is emitted again to form the second GaSb layer 113. In this step, the beam flux of Ga is, for example, $5.0 \times 10^{-8}$ Torr, and the V/III ratio is 10. Under these conditions, the growth rate of the second GaSb layer 113 is 0.30 µm/h. Film forming is performed for about 80 minutes until the thickness of the second GaSb layer 113 reaches 400 nm, and then the Ga beam is stopped. The second GaSb layer 113 formed at a substrate temperature of 440° C. as described above has n-type conductivity.

Through the above process, the semiconductor crystal substrate of the present embodiment is produced. Although an n-type GaSb substrate is used as the GaSb substrate 111 in the present embodiment, a p-type GaSb substrate may also be used as the GaSb substrate 111. Also, the plane direction of the GaSb substrate 111 is not limited to (001), and an off substrate may also be used as the GaSb substrate 111. Further, an InAs substrate may be used in place of the GaSb substrate 111.

Second Embodiment

Figure 11:
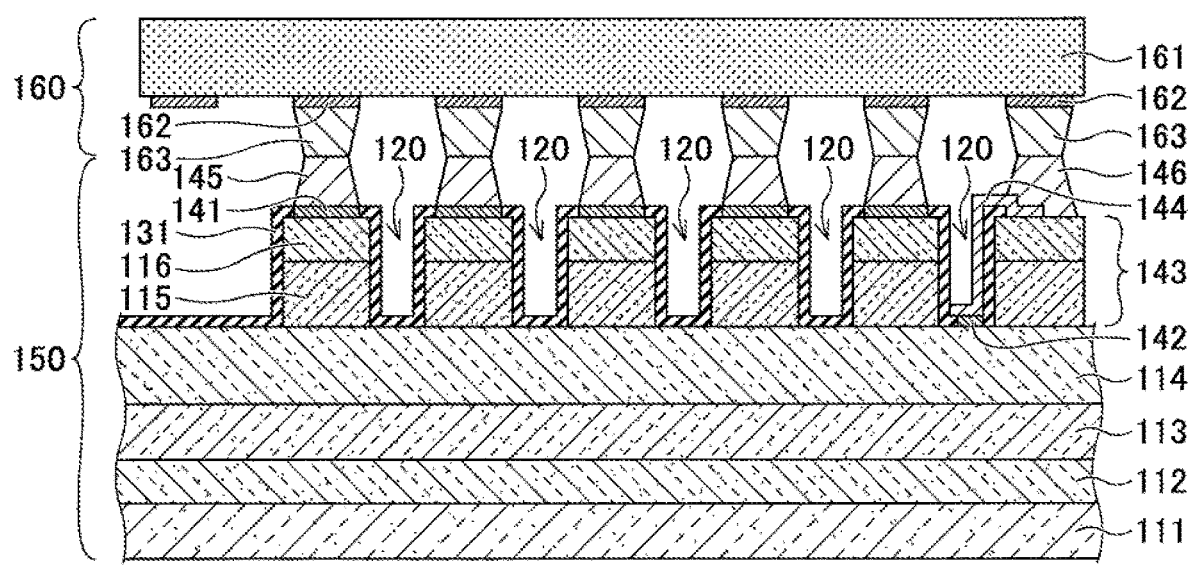
FIG. 11 is a drawing illustrating an example of a configuration of an infrared detector according to a second embodiment.

Next, a second embodiment is described. In the second embodiment, an infrared detector produced by using the semiconductor crystal substrate of the first embodiment is described. FIG. 11 illustrates an example of a configuration of the infrared detector of the second embodiment, and FIG. 12 is an enlarged view of a part of the infrared detector corresponding to a pixel.

Figure 12:
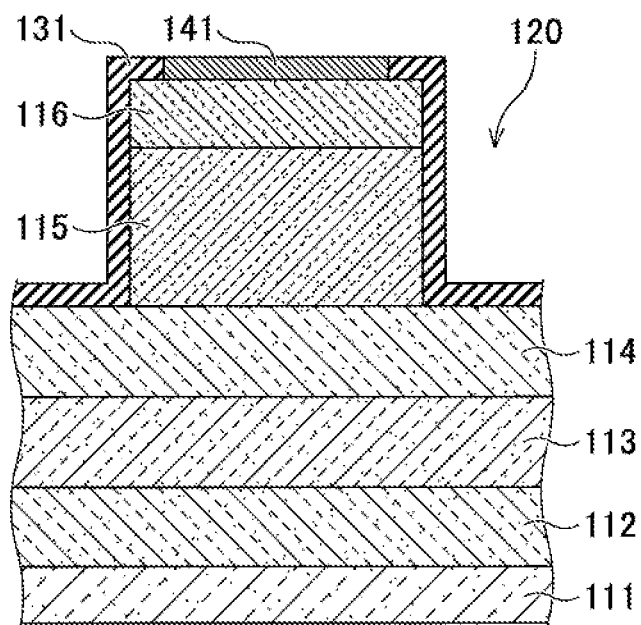
FIG. 12 is an enlarged view of a part of the infrared detector of FIG. 11.

As illustrated by FIGS. 11 and 12, the infrared detector of the second embodiment includes a GaSb substrate 111, a first GaSb layer 112 formed on the GaSb substrate 111, a second GaSb layer 113 formed on the first GaSb layer 112, a p-type contact layer 114 formed on the second GaSb layer 113, an infrared absorption layer 115 formed on the p-type contact layer 114, and an n-type contact layer 116 formed on the infrared absorption layer 115. The GaSb substrate 111 is an n-type GaSb (001) substrate, the first GaSb layer 112 has a thickness of about 100 nm, and the second GaSb layer 113 has a thickness of about 400 nm. The p-type contact layer 114 is a p-type GaSb layer that has a thickness of 500 nm and is doped with Be as an impurity element. The infrared absorption layer 115 has an InAs/GaSb superlattice (T2SL) structure. Specifically, the infrared absorption layer 115 is formed by alternately stacking an InAs layer with a thickness of about 2 nm and a GaSb layer with a thickness of about 2 nm. In the present embodiment, the infrared absorption layer 115 includes 200 pairs of the InAs layer and the GaSb layer, and has a thickness of about 800 nm. The n-type contact layer 116 is an n-type InAs layer that has a thickness of about 30 nm and is doped with Si as an impurity element. In the present application, the p-type contact layer 114 may be referred to as a first contact layer, and the n-type contact layer 116 may be referred to as a second contact layer.

Pixel separating grooves 120 are formed in the n-type contact layer 116 and the infrared absorption layer 115 to separate pixels of the infrared detector. A passivation film 131 composed of SiN is formed on the side surfaces and the bottom surfaces of the pixel separating grooves 120. In the infrared detector of the present embodiment, multiple pixels separated by the pixel separating grooves 120 are arranged two-dimensionally. An electrode 141 is formed on the n-type contact layer 116 of each of the pixels separated by the pixel separating grooves 120, and an electrode 142 is formed on the p-type contact layer 114. The infrared absorption layer 115 and the n-type contact layer 116 near the electrode 142 form a wiring support 143. Also, a wiring layer 144 is formed to extend from the electrode 142, via the side surface of the wiring support 143, to the upper surface of the wiring support 143. Accordingly, the infrared absorption layer 115 and the n-type contact layer 116 forming the wiring support 143 are not used for infrared detection. Each of the electrodes 141 and 142 is formed of a metal multilayer film of Ti, Pt, and Au. In the present embodiment, a structure or a device with the above configuration may be referred to as an infrared detector or an infrared detecting device 150. The infrared detector of the present embodiment can detect infrared radiation that enters from the back side of the GaSb substrate 111.

Figure 13:
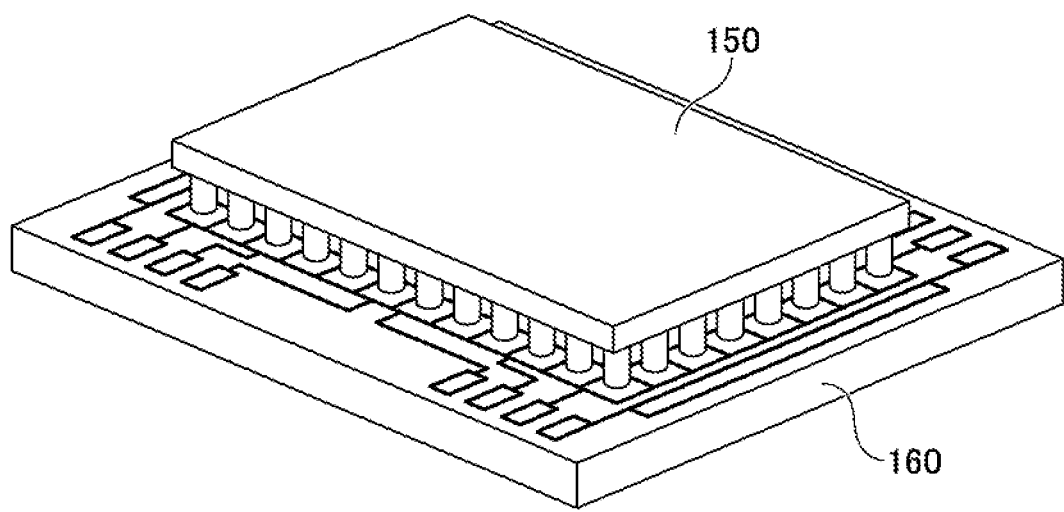
FIG. 13 is a perspective view of the infrared detector of FIG. 11.

As illustrated by FIG. 11, the infrared detector of the present embodiment has a configuration where a signal reading circuit device 160 is connected to the infrared detecting device 150. For this connection, bumps 145 are formed on the electrodes 141 of the infrared detecting device 150, and a bump 146 is formed on the wiring layer 144 of the infrared detecting device 150. The signal reading circuit device 160 includes a circuit board 161 on which a signal reading circuit(s) is formed. Electrodes 162 are formed on the circuit board 161, and bumps 163 are formed on the electrodes 162. The bumps 145 and 146 and the bumps 163 are formed to face each other. The infrared detecting device 150 and the signal reading circuit device 160 are connected to each other by connecting the bumps 145 and 146 with the corresponding bumps 163. FIG. 13 is a perspective view of the infrared detector of the present embodiment.

<Method for Producing Infrared Detector>

Next, an exemplary method for producing an infrared detector according to the second embodiment is described with reference to FIGS. 14A through 17B. The infrared detector of the second embodiment can be produced by using the semiconductor crystal substrate of the first embodiment. Each of FIGS. 14A, 15A, 16A, and 17A illustrates the whole of a structure relevant to the corresponding step, and each of FIGS. 14B, 15B, 16B, and 17B is an enlarged view of a part of the structure corresponding to a pixel.

Figure 14A:
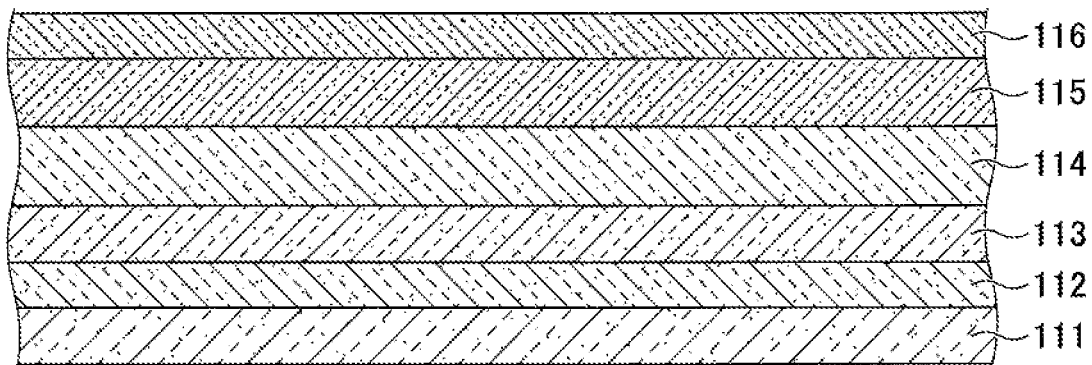
FIGS. 14A and 14B are drawings illustrating steps of a method for producing an infrared detector according to the second embodiment.
Figure 14B:
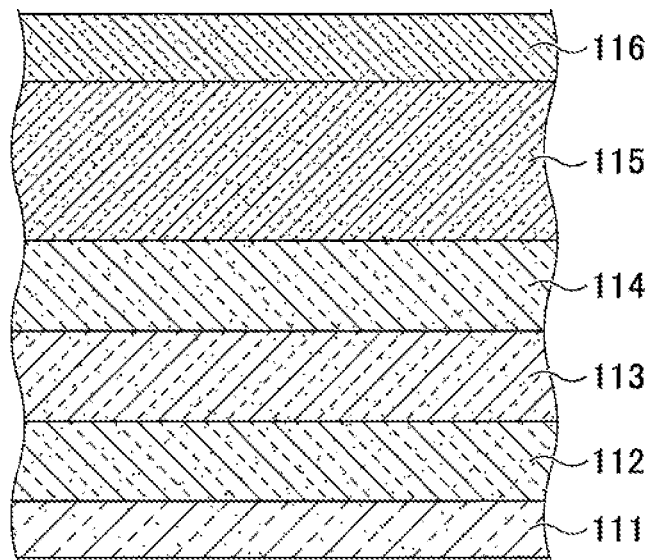

First, as illustrated by FIGS. 14A and 14B, the first GaSb layer 112, the second GaSb layer 113, the p-type contact layer 114, the infrared absorption layer 115, and the n-type contact layer 116 are epitaxially grown in this order on the GaSb substrate 111 by MBE. A structure obtained by sequentially forming the first GaSb layer 112 and the second GaSb layer 113 on the GaSb substrate 111 corresponds to the semiconductor crystal substrate of the first embodiment. Therefore, detailed descriptions of the GaSb substrate 111, the first GaSb layer 112, and the second GaSb layer 113 are omitted here.

Specifically, the first GaSb layer 112 and the second GaSb layer 113 are sequentially formed on the GaSb substrate 111, and the p-type contact layer 114 is formed on the second GaSb layer 113. The p-type contact layer 114 is a p-type GaSb layer that is formed by emitting Ga, Sb, and Be beams. In this step, the temperature of the Be cell is adjusted so that the concentration of Be that is an impurity element used as a dopant of the p-type contact layer 114 becomes $5.0 \times 10^{18}$ $cm^{-3}$. Also in this step, the beam flux of Ga is $5.0 \times 10^{-8}$ Torr, the beam flux of Sb is $5.0 \times 10^{-7}$ Torr, and the V/III ratio is 10. Under these conditions, the growth rate of GaSb is 0.30 μm/h. Film forming is performed for about 100 minutes until the thickness of the p-type contact layer 114 reaches 500 nm, and then the Be and Ga beams are stopped.

Next, the infrared absorption layer 115 with an InAs/GaSb superlattice structure is formed on the p-type contact layer 114. Specifically, the Sb beam is stopped, and In and As beams are emitted. In this step, the beam flux of In is $5.0 \times 10^{-8}$ Torr, the beam flux of As is $5.0 \times 10^{-7}$ Torr, and the V/III ratio is 10. Under these conditions, the growth rate of InAs is 0.30 μm/h. Film forming is performed for about 36 seconds until the thickness of an InAs layer reaches 2 nm, and then the In and As beams are stopped. Next, after an interval of three seconds, Ga and Sb beams are emitted. In this step, the beam flux of Ga is $5.0 \times 10^{-8}$ Torr, the beam flux of Sb is $5.0 \times 10^{-7}$ Torr, and the V/III ratio is 10. Under these conditions, the growth rate of GaSb is 0.30 μm/h. Film forming is performed for about 36 seconds until the thickness of a GaSb layer reaches 2 nm, and then the Ga and Sb beams are stopped. After an interval of three seconds, the above steps are repeated. In this example, when the formation of an InAs layer and the formation of a GaSb layer constitute one cycle, the cycle is repeated 200 times to form the infrared absorption layer 115 with a total thickness of about 800 nm.

Next, the n-type contact layer 116 is formed on the infrared absorption layer 115. The n-type contact layer 116 is an n-type InAs layer that is formed by emitting In, As, and Si beams. In this step, the temperature of the Si cell is adjusted so that the concentration of Si that is an impurity element used as a dopant of the n-type contact layer 116 becomes $5.0 \times 10^{18}$ $cm^{-3}$. Also in this step, the beam flux of In is $5.0 \times 10^{-8}$ Torr, the beam flux of As is $5.0 \times 10^{-7}$ Torr, and the V/III ratio is 10. Under these conditions, the growth rate of InAs is 0.30 μm/h. Film forming is performed for about 6 minutes until the thickness of an InAs layer reaches 30 nm, and then the In and Si beams are stopped.

Next, in a state where the As beam is being emitted, the substrate temperature is dropped to 400° C. Then, the As beam is stopped, and a structure where epitaxial films are formed on the GaSb substrate 111 is taken out of the vacuum chamber of the MBE apparatus.

Figure 15A:
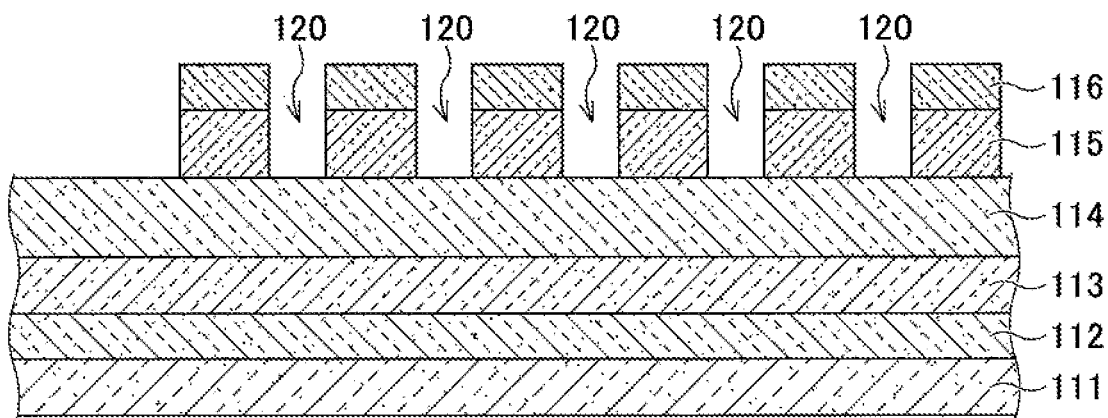
FIGS. 15A and 15B are drawings illustrating steps of the method for producing the infrared detector according to the second embodiment.
Figure 15B:
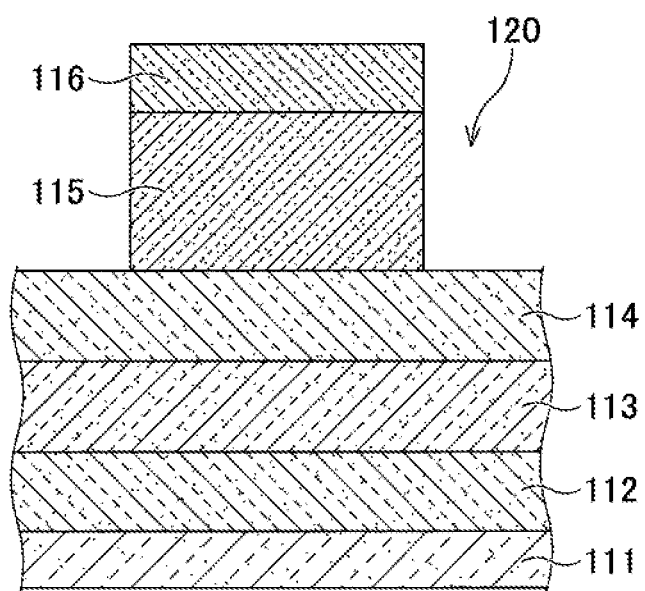

Next, as illustrated by FIGS. 15A and 15B, portions of the n-type contact layer 116 and the infrared absorption layer 115 are removed to form the pixel separating grooves 120. Specifically, a photoresist is applied to the n-type contact layer 116, and the photoresist is exposed and developed by an exposure apparatus to form a resist pattern (not shown) having openings in areas where the pixel separating grooves 120 are to be formed. Then, portions of the n-type contact layer 116 and the infrared absorption layer 115 in the areas not covered by the resist pattern are removed by dry etching using a $CF_4$ gas to form the pixel separating grooves 120. As a result, pixels having a mesa structure and separated by the pixel separating grooves 120 are formed. In the present embodiment, the size of each pixel is 50 μm×50 μm, and 256×256 pixels are formed in the infrared detector.

Figure 16A:
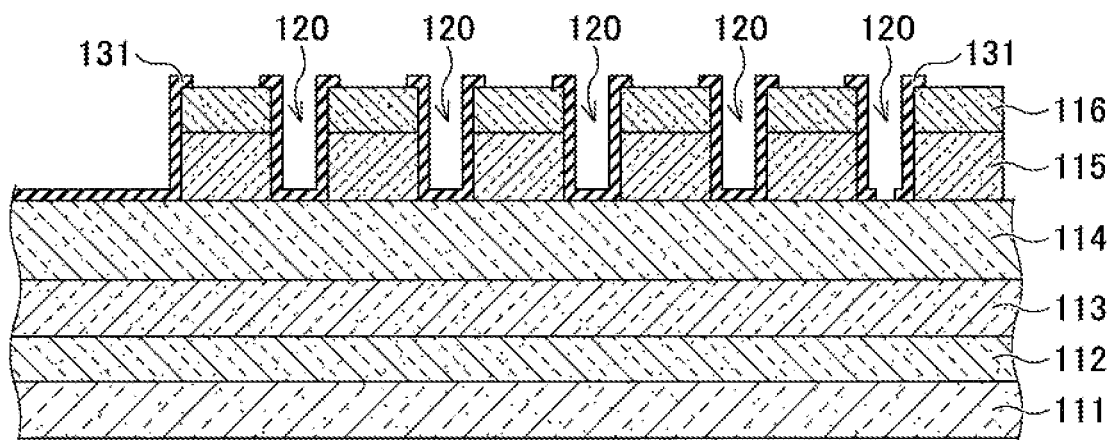
FIGS. 16A and 16B are drawings illustrating steps of the method for producing the infrared detector according to the second embodiment.
Figure 16B:
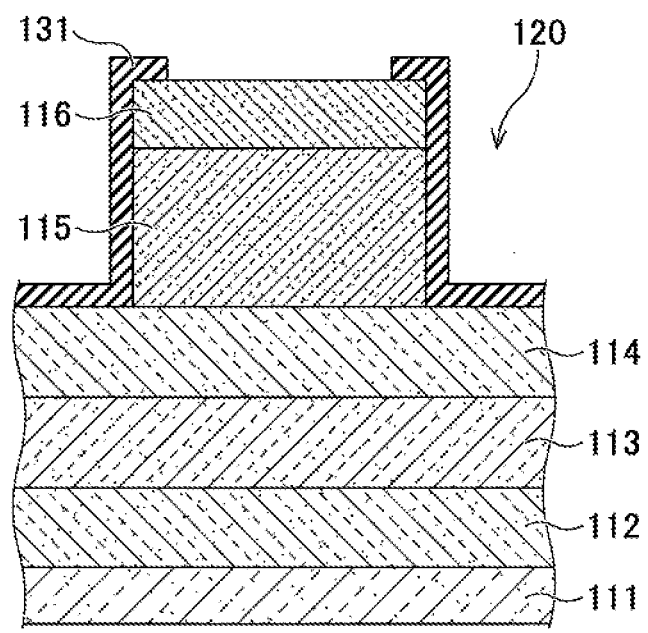

Next, as illustrated by FIGS. 16A and 16B, the passivation film 131 is formed on the upper surface of the n-type contact layer 116 and the side surfaces of the n-type contact layer 116 and the infrared absorption layer 115 forming each pixel, and on the upper surface of the p-type contact layer 114 between pixels. The passivation film 131 is an SiN film with a thickness of 100 nm and is formed by plasma chemical vapor deposition (CVD) using $SiH_4$ and $NH_3$ gases.

Next, a photoresist is applied to the structure of FIG. 16A, and the photoresist is exposed and developed by an exposure apparatus to form a resist pattern (not shown) having openings in areas where the electrodes 141 and 142 are to be formed. Then, portions of the passivation film 131 in the areas not covered by the resist pattern are removed by dry etching using a $CF_4$ gas to expose portions of the n-type contact layer 116 and the p-type contact layer 114 in those areas.

Figure 17A:
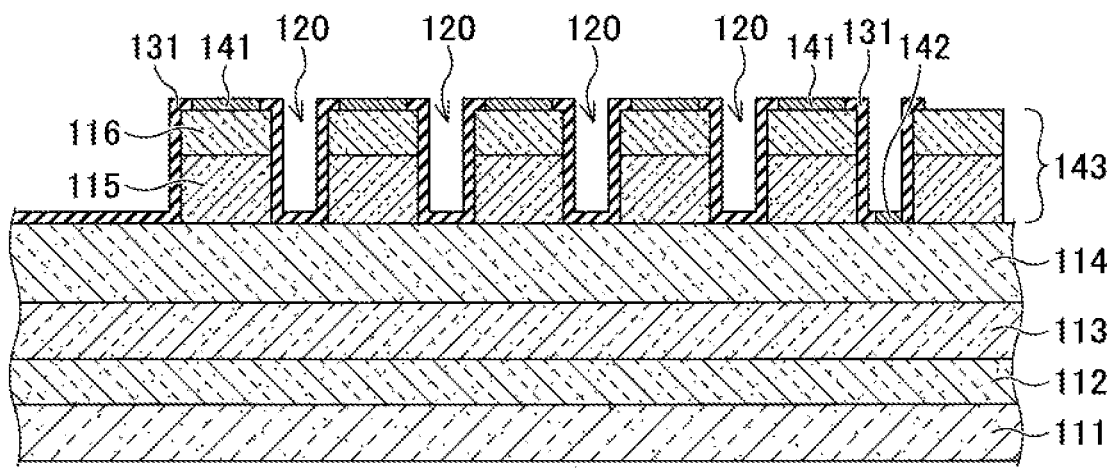
FIGS. 17A and 17B are drawings illustrating steps of the method for producing the infrared detector according to the second embodiment.
Figure 17B:
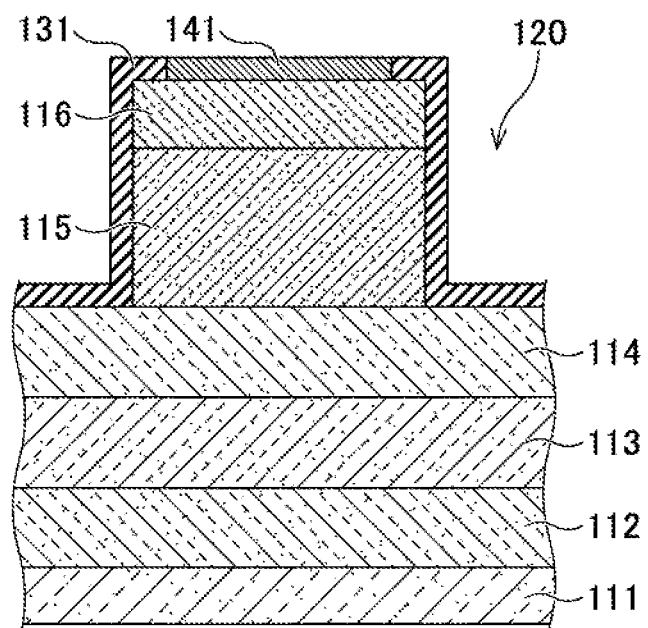

Next, as illustrated by FIGS. 17A and 17B, the electrodes 141 are formed on the exposed portions of the n-type contact layer 116 and the electrode 142 is formed on the exposed portion of the p-type contact layer 114. Specifically, a resist pattern (not shown) is formed to have openings in areas where the electrodes 141 and 142 are to be formed. Next, a metal multilayer film made of Ti, Pt, and Au is formed by vacuum deposition or sputtering, and the metal multilayer film is immersed in, for example, an organic solvent to remove, together with the resist pattern, portions of the metal multilayer film on the resist pattern by a lift-off technique. The remaining portions of the metal multilayer film form the electrodes 141 on the n-type contact layer 116 and the electrode 142 on the p-type contact layer 114.

Next, as illustrated in FIG. 11, the wiring layer 144 is formed on the electrode 142 and the side and upper surfaces of the wiring support 143, the bumps 145 are formed on the electrodes 141, and the bump 146 is formed on a portion of the wiring layer 144 above the wiring support 143. The formed bumps 145 and 146 are connected with the bumps 163 of the signal reading circuit device 160 by flip-chip bonding. As a result, the infrared detecting device 150 and the signal reading circuit device 160 are connected to each other.

Configurations of the infrared detector not described above are substantially the same as those in the first embodiment.

Third Embodiment

Figure 18:
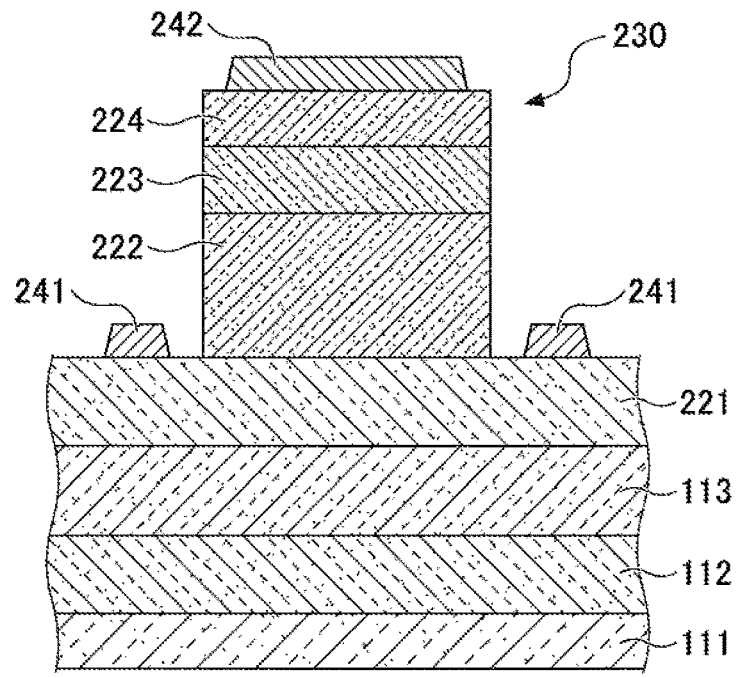
FIG. 18 is a drawing illustrating an example of a configuration of a semiconductor laser according to a third embodiment.

Next, a third embodiment is described. In the third embodiment, a GaSb semiconductor laser produced by using the semiconductor crystal substrate of the first embodiment is described. FIG. 18 illustrates an exemplary configuration of the semiconductor laser of the third embodiment.

The semiconductor laser of the third embodiment includes the semiconductor crystal substrate of the first embodiment where the first GaSb layer 112 and the second GaSb layer 113 are sequentially formed on the GaSb substrate 111. The semiconductor laser also includes a p-type GaSb cladding layer 221, a multi-quantum well (MQW) layer 222, an n-type GaSb cladding layer 223, and an n-type InAs layer 224 that are formed on the second GaSb layer 113 in this order. The p-type GaSb cladding layer 221 has a thickness of about 500 nm and is doped with Be as a p-type impurity element. The MQW layer 222 is formed by alternately stacking a GaSb layer with a thickness of about 5 nm and an InAs layer with a thickness of about 5 nm. In the present embodiment, the MQW layer 222 includes 20 pairs of the GaSb layer and the InAs layer. The n-type GaSb cladding layer 223 has a thickness of about 100 nm, is doped with Si as an n-type impurity element, and has a carrier concentration of $5.0 \times 10^1$ $cm^{-3}$. The n-type InAs layer 224 has a thickness of about 30 nm.

Next, portions of the n-type InAs layer 224, the n-type GaSb cladding layer 223, and the MQW layer 222 are removed to form a mesa structure 230. Specifically, portions of the n-type InAs layer 224, the n-type GaSb cladding layer 223, and the MQW layer 222 are removed by dry etching using a $CF_4$ gas as an etching gas to expose portions of the p-type GaSb cladding layer 221 and thereby form the mesa structure 230.

Next, lower electrodes 241 are formed on the exposed portions of the p-type GaSb cladding layer 221, and an upper electrode 242 is formed on the upper surface of the n-type InAs layer 224. Each of the lower electrodes 241 and the upper electrode 242 is formed of, for example, a metal multilayer film of Ti, Pt, and Au.

Then, the GaSb substrate 111 is cleaved to form a stripe-shaped piece having a width of 20 μm and a length of 50 μm. As a result, the semiconductor laser of the present embodiment is produced. The semiconductor laser is an edge emitting laser with a wavelength of 3.0 μm.

Fourth Embodiment

Figure 19:
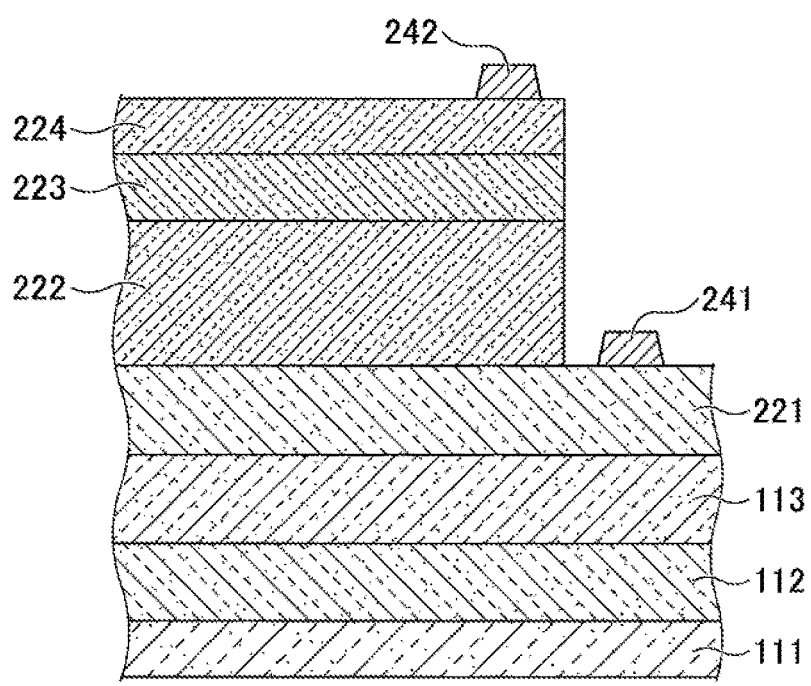
FIG. 19 is a drawing illustrating an example of a configuration of a light-emitting diode according to a fourth embodiment.

Next, a fourth embodiment is described. In the fourth embodiment, a GaSb light emitting diode (LED) produced by using the semiconductor crystal substrate of the first embodiment is described. FIG. 19 illustrates an exemplary configuration of the light emitting diode of the fourth embodiment.

The light emitting diode of the fourth embodiment includes the semiconductor crystal substrate of the first embodiment. Similarly to the third embodiment, after the p-type GaSb cladding layer 221, the MQW layer 222, the n-type GaSb cladding layer 223, and the n-type InAs layer 224 are epitaxially grown on the second GaSb layer 113 by MBE, the lower electrode 241 and the upper electrode 242 are formed.

Then, the GaSb substrate 111 is cleaved to form a chip having a width of 50 μm and a length of 50 μm. As a result, the light emitting diode of the fourth embodiment is produced. The light emitting diode emits light from the side on which the n-type InAs layer 224 is formed. Accordingly, the area of the n-type InAs layer 224 where the upper electrode 242 is not present is preferably as large as possible.

Fifth Embodiment

Figure 20:
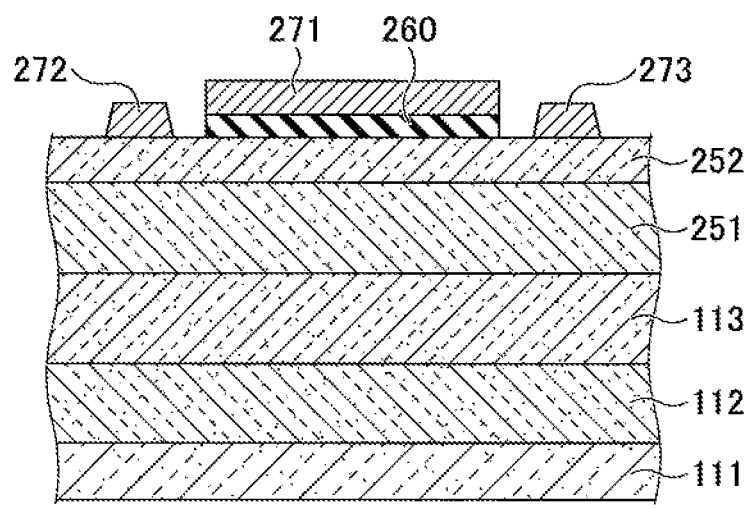
FIG. 20 is a drawing illustrating an example of a configuration of a field-effect transistor according to a fifth embodiment.

Next, a fifth embodiment is described. In the fifth embodiment, a field effect transistor (FET) produced by using the semiconductor crystal substrate of the first embodiment is described. FIG. 20 illustrates an exemplary configuration of the field effect transistor of the fifth embodiment.

The field effect transistor of the fifth embodiment includes the semiconductor crystal substrate of the first embodiment where the first GaSb layer 112 and the second GaSb layer 113 are sequentially formed on the GaSb substrate 111. An $Al_{0.8}Ga_{0.2}Sb$ layer 251 and a channel layer 252 are sequentially formed by MBE on the second GaSb layer 113. The thickness of the $Al_{0.8}Ga_{0.2}Sb$ layer 251 is about 2 nm. The channel layer 252 is a p-type $In_{0.2}Ga_{0.8}Sb$ layer with a thickness of 5 nm, is doped with Be as a p-type impurity element, and has a carrier concentration of $5.0 \times 10^{18}$ $cm^{-3}$.

Next, an insulating film 260 is formed by atomic layer deposition (ALD) on the channel layer 252. The insulating film 260 is an $Al_2O_3$ film with a thickness of 3 nm.

Next, a gate electrode 271 is formed on the insulating film 260, and a source electrode 272 and a drain electrode 273 are formed on the channel layer 252. The gate electrode 271 may be a tungsten (W) film with a thickness of about 100 nm, and may be formed by CVD on the insulating layer 260. The gate electrode 271 is formed to have a gate length of 30 nm. Next, portions of the insulating film 260, which correspond to areas where the source electrode 272 and the drain electrode 273 are to be formed, are removed. Then, the source electrode 272 and the drain electrode 273 are formed in the areas with, for example, Ni films.

Through the above process, the field effect transistor of the fifth embodiment is produced.

Sixth Embodiment

Next, a sixth embodiment is described. In the sixth embodiment, a thermoelectric transducer produced by using the semiconductor crystal substrate of the first embodiment is described. The thermoelectric transducer of the sixth embodiment is described below with reference to FIGS. 21 and 22.

The thermoelectric transducer of the sixth embodiment includes the semiconductor crystal substrate of the first embodiment where the first GaSb layer 112 and the second GaSb layer 113 are sequentially formed on the GaSb substrate 111. A superlattice layer 280 and a cap layer 281 are sequentially formed by MBE on the second GaSb layer 113. The superlattice layer 280 is formed by alternately stacking a GaSb layer with a thickness of about 5 nm and an InAs layer with a thickness of about 5 nm. In the present embodiment, the superlattice layer 280 includes 500 pairs of the GaSb layer and the InAs layer. The cap layer 281 is a non-doped InAs film with a thickness of 30 nm.

Figure 21:
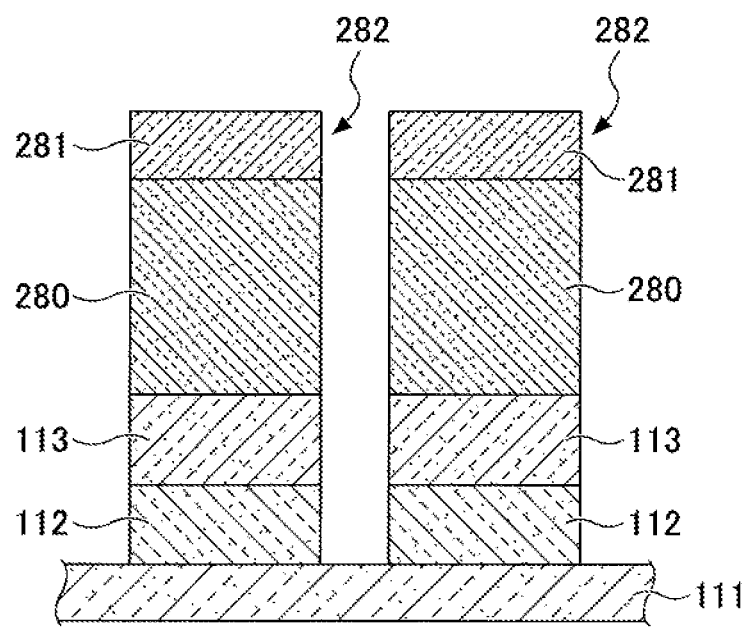
FIG. 21 is a drawing illustrating a thermoelectric transducer according to a sixth embodiment.
Figure 22:
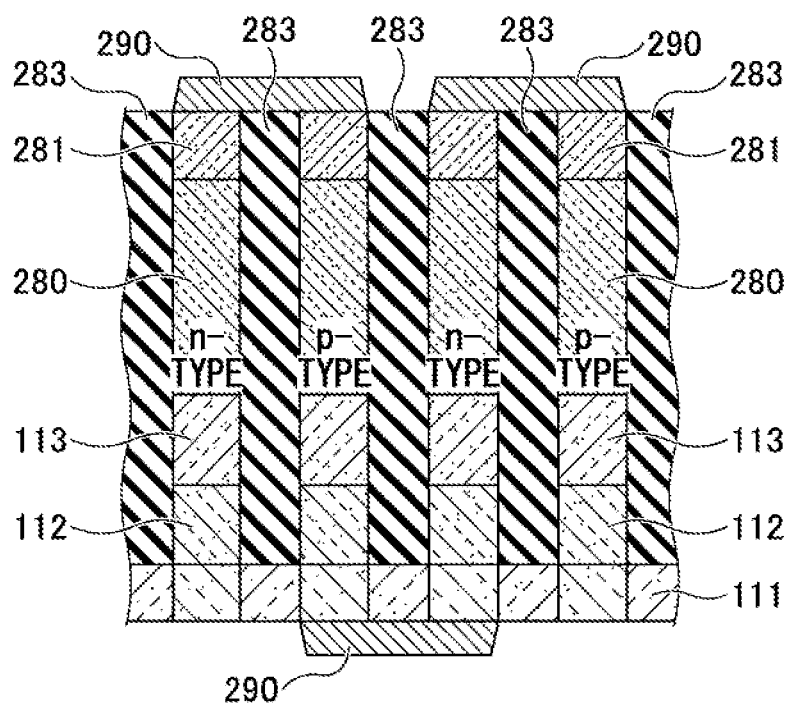
FIG. 22 is another drawing illustrating the thermoelectric transducer according to the sixth embodiment.

Next, portions of the cap layer 281, the superlattice layer 280, the second GaSb layer 113, and the first GaSb layer 112 are removed to form mesa structures 282. Specifically, portions of the cap layer 281, the superlattice layer 280, the second GaSb layer 113, and the first GaSb layer 112 are removed by dry etching using a $CF_4$ gas as an etching gas to form the mesa structures 282. FIG. 21 illustrates a resulting structure.

Next, an $SiO_2$ film 283 is formed to fill a gap between the mesa structures 282. Next, the back side of the GaSb substrate 111 is ground by chemical mechanical polishing (CMP) to reduce the thickness of the GaSb substrate 111 to about 3 μm. Next, n-type and p-type dopants are ion-implanted into the mesa structures 282 and activation annealing is performed to form n-type regions (n-type elements) and p-type regions (p-type elements). Then, electrodes 290 are formed on the ends of the n-type elements and the p-type elements such that the n-type elements and the p-type elements are connected in series. Each of the electrodes 290 is formed of, for example, a metal multilayer film of Ti, Pt, and Au.

An aspect of this disclosure makes it possible to provide a semiconductor crystal substrate including a GaSb layer with a highly-flat surface.

All examples and conditional language provided herein are intended for the pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of producing a semiconductor crystal substrate, the method comprising:
    forming a first buffer layer on a crystal layer by molecular beam epitaxy with a material including GaSb, the crystal layer being formed of a material including one of GaSb and InAs, a composition ratio of Ga in the first buffer layer being greater than a composition ratio of Sb in the first buffer layer, and the first buffer layer having a p-type conductivity; and
    forming a second buffer layer on the first buffer layer by molecular beam epitaxy with a material including GaSb, a composition ratio of Sb in the second buffer layer being greater than a composition ratio of Ga in the second buffer layer, and the second buffer layer having an n-type conductivity, wherein
    the first buffer layer is formed at a substrate temperature greater than or equal to 470° C. and less than or equal to 550° C.; and
    the second buffer layer is formed at a substrate temperature greater than or equal to 420° C. and less than or equal to 460° C.

2. The method as claimed in claim 1, wherein the first buffer layer is formed at a substrate temperature greater than or equal to 500° C. and less than or equal to 550° C.

3. The method as claimed in claim 1, wherein the molecular beam epitaxy is solid source molecular beam epitaxy.

4. The method as claimed in claim 1, wherein
    the first buffer layer is formed of the material including GaSb and one or both of In and As; and
    the second buffer layer is formed of the material including GaSb and one or both of In and As.

5. A method of producing an infrared detector, the method comprising:
    forming a first contact layer having the n-type or p-type conductivity on the second buffer layer of the semiconductor crystal substrate produced by the method of claim 1;
    forming an infrared absorption layer having a superlattice structure on the first contact layer; and
    forming a second contact layer having the other of the n-type or the p-type conductivity on the infrared absorption layer.

6. The method as claimed in claim 5, wherein
    the first contact layer is p-type, and the first contact layer is formed of a material including GaSb;
    the infrared absorption layer having the superlattice structure is formed by alternately stacking a GaSb layer and an InAs layer; and
    the second contact layer is n-type, and the second contact layer is formed of a material including InAs.

* * * * *